(12) United States Patent
Taghvaei et al.

(10) Patent No.: US 11,721,380 B2
(45) Date of Patent: *Aug. 8, 2023

(54) WORD-LINE DRIVER AND METHOD OF OPERATING A WORD-LINE DRIVER

(71) Applicant: Taiwan Semiconductor Manufacturing Company Limited, Hsinchu (TW)

(72) Inventors: Ali Taghvaei, Ontario (CA); Atul Katoch, Kanata (CA)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/336,626

(22) Filed: Jun. 2, 2021

(65) Prior Publication Data

US 2021/0287729 A1   Sep. 16, 2021

Related U.S. Application Data

(63) Continuation of application No. 16/884,143, filed on May 27, 2020, now Pat. No. 11,031,063, which is a continuation of application No. 16/590,869, filed on
(Continued)

(51) Int. Cl.
*G11C 5/06* (2006.01)
*G11C 11/40* (2006.01)
(Continued)

(52) U.S. Cl.
CPC ............... *G11C 11/40* (2013.01); *G11C 5/14* (2013.01); *G11C 5/148* (2013.01); *G11C 8/08* (2013.01);
(Continued)

(58) Field of Classification Search
CPC .. G11C 11/40; G11C 8/08; G11C 8/10; G11C 5/14; G11C 5/148; G11C 2207/2227
(Continued)

(56) References Cited

U.S. PATENT DOCUMENTS 5,896,345 A    4/1999  Sohn
9,001,569 B1 *  4/2015  Jain ...................... G11C 11/418
                                                    365/230.06
(Continued)

*Primary Examiner* — Hoai V Ho
*Assistant Examiner* — Minh Dinh
(74) *Attorney, Agent, or Firm* — Jones Day

(57) ABSTRACT

Word-line drivers, memories, and methods of operating word-line drivers are provided. A word-line driver coupled to an array of memory cells includes a decoder powered by a first power supply. The decoder is configured to decode an address to provide a plurality of word-line signals. The word-line driver also includes a plurality of output stages powered by a second power supply that is different than the first power supply. Each of the output stages includes a first transistor having a gate controlled by a first control signal and an inverter. The inverter is coupled between the first transistor and a ground and has an input coupled to the decoder to receive one of the word-line signals. The word-line driver also includes pull-down circuitry coupled between the gates of the first transistors and the ground and activated by a second control signal.

20 Claims, 5 Drawing Sheets

Related U.S. Application Data

Oct. 2, 2019, now Pat. No. 10,699,766, which is a continuation of application No. 15/725,460, filed on Oct. 5, 2017, now Pat. No. 10,475,502.

(60) Provisional application No. 62/433,270, filed on Dec. 13, 2016.

(51) Int. Cl.
- *G11C 5/14* (2006.01)
- *G11C 8/08* (2006.01)
- *G11C 8/10* (2006.01)

(52) U.S. Cl.
CPC ........ *G11C 8/10* (2013.01); *G11C 2207/2227* (2013.01)

(58) Field of Classification Search
USPC .......................................................... 365/72
See application file for complete search history.

(56) References Cited

U.S. PATENT DOCUMENTS

| | | | |
|---|---|---|---|
| 9,997,236 B1 | 6/2018 | Pathak | |
| 10,475,502 B2* | 11/2019 | Taghvaei | G11C 8/08 |
| 10,699,766 B2* | 6/2020 | Taghvaei | G11C 11/40 |
| 11,031,063 B2* | 6/2021 | Taghvaei | G11C 5/14 |
| 2005/0018489 A1* | 1/2005 | Hosono | G11C 16/3418 365/185.29 |
| 2006/0215480 A1* | 9/2006 | Kim | G11C 13/0028 365/230.06 |
| 2007/0030741 A1* | 2/2007 | Nii | G11C 5/14 365/189.11 |
| 2011/0188326 A1* | 8/2011 | Lee | G11C 7/00 365/189.11 |
| 2018/0166115 A1 | 6/2018 | Taghvaei et al. | |

* cited by examiner

WORD-LINE DRIVER AND METHOD OF OPERATING A WORD-LINE DRIVER

CROSS-REFERENCE TO RELATED APPLICATIONS

This application is a continuation application of U.S. patent application Ser. No. 16/884,143, filed May 27, 2020, which is a continuation of U.S. patent application Ser. No. 16/590,869, filed Oct. 2, 2019, now U.S. Pat. No. 10,699,766, which is a continuation of U.S. patent application Ser. No. 15/725,460, now U.S. Pat. No. 10,475,502, filed Oct. 5, 2017, which claims priority to U.S. Provisional Patent Application No. 62/433,270, filed Dec. 13, 2016, all of which are incorporated herein by reference in their entirety.

BACKGROUND

The present invention relates generally to semiconductor memory designs, and, more particularly, to a memory word-line driver design.

The core of a semiconductor memory comprises at least one two-dimensional memory cell array, where information is stored. Traditionally, word lines select rows, which activate cells, and bit lines select columns, which access (i.e., read or write) the cells. When a word line and a bit line are activated, a particular memory cell connected to them is selected.

To activate a word line, its voltage is normally set to a high voltage, which is equal to a positive supply voltage in complimentary-metal-oxide-semiconductor (CMOS) circuitry. Setting a word line to a low voltage, which is a voltage complimentary to the positive supply voltage, deactivates the word line. While the low voltage is customarily set to ground, or 0 V, the value for the high voltage can be different for various semiconductor manufacturing technologies. For instance, in a deep-sub-micron technology, a high voltage can be 1.2 V or even lower, while in a sub-micron technology the high voltage can be 2.5 V. But for a given memory chip and a given technology, the high voltage is normally designed to a fixed value, and this is particularly true for CMOS memory circuitry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
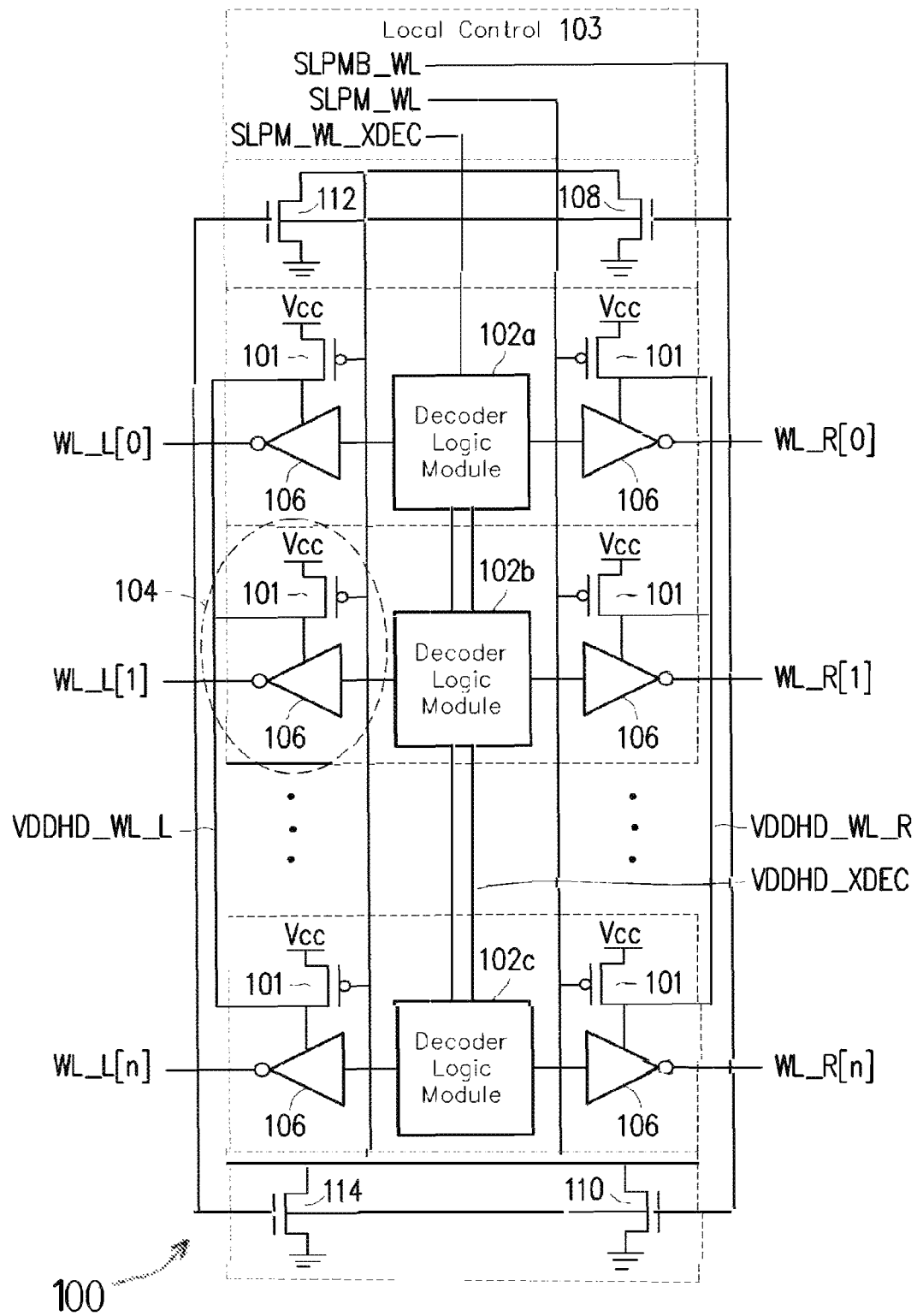
FIG. 1 is a circuit diagram depicting a word-line driver, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a circuit diagram depicting a word-line driver 100, in accordance with some embodiments. As seen in the figure, the word-line driver 100 is coupled to n+1 word lines disposed to the left of the word-line driver 100, with these word lines being labeled WL_L[0] through WL_L[n]. The word-line driver 100 is also coupled to n+1 word lines disposed to the right of the word-line driver 100, with these word lines being labeled WL_R[0] through WL_R[n]. To drive the word lines, the word-line driver 100 includes a decoder and a plurality of output stages 104.

The decoder includes multiple decoder logic modules 102a, 102b, 102c and is configured to decode an input address to provide a plurality of word-line signals. In embodiments, the input address to be decoded is provided via a line SLPM_WL_XDEC shown in FIG. 1. Each of the decoder logic modules 102a, 102b, 102c includes multiple transistors, with each of these transistors being relatively small in size, in embodiments. Due to their relatively small sizes, these transistors consume only a minimal amount of power and are not a significant source of leakage current.

Each of the decoder logic modules 102a, 102b, 102c of the decoder is coupled to one or more output stages 104. In the illustration of FIG. 1, only one output stage 104 is shown for each of the decoder logic modules 102a, 102b, 102c. The output stages 104 may also be referred to as "final stages" because they form the end of the word-line driver 100 and are coupled directly to the word lines. Each output stage of the plurality of output stages 104 includes a first transistor 101 having a gate controlled by a first control signal SLPM_WL. In embodiments, the first control signal SLPM_WL is a sleep signal used to power down the output stages 104 in a standby mode of operation and to wake up the output stages 104 in an active mode of operation. The standby and active modes are described in further detail below. Each of the output stages 104 further includes an inverter 106 coupled between the first transistor 101 and a ground (e.g., Vss or GND). Specifically, in the embodiment of FIG. 1, the first transistor 101 comprises a p-type metal-oxide-semiconductor (PMOS) transistor with a source terminal coupled to a positive supply voltage (e.g., Vcc) and a drain terminal coupled to the inverter 106. Details of the electrical connection between the first transistor 101 and the inverter 106 are described in further detail below with reference to FIG. 3.

The inverter 106 has an input coupled to a decoder logic module to receive one of the word-line signals generated by the decoder. The inverter 106 generates an output that is an inverted version of the word-line signal input, and the output is used to drive a word line coupled to the inverter 106. In embodiments, the word-line driver 100 is coupled to a memory array of a memory chip (not shown in FIG. 1) that operates in both active and standby modes. In the active mode of operation, the memory array is being actively accessed (i.e., read from or written to), and an output stage of the output stages 104 provides a current source to (i) pull up a corresponding word line to a high voltage when the word line is selected, and (ii) pull down the word line to a low voltage when the word line is not selected. In embodiments, the high and low voltages are predetermined voltage values (e.g., positive supply voltage and ground, respectively). By contrast, in the standby mode, the memory chip is not being actively accessed, and the output stage clamps the word-line voltage to a predetermined low voltage.

In embodiments of the present disclosure, each of the output stages 104 includes multiple transistors that are relatively large in size, in comparison to the relatively small transistors of the decoder logic modules 102a, 102b, 102c. Thus, for instance, the first transistor 101 is a relatively large transistor, and the inverter 106 likewise includes one or more relatively large transistors, in embodiments. In conventional word-line drivers, the relatively large transistors of the output stage form a large leakage path in the standby mode of operation. Leakage current that flows through the leakage path results in a relatively large amount of undesirable leakage power in the standby mode.

To address the leakage problem of the conventional word-line drivers, the word-line driver 100 of the present disclosure enables the output stages 104 to be powered down (i.e., turned off) in the standby mode, thus providing a reduction of leakage power. When the memory chip transitions to the active mode, the output stages 104 are powered up (i.e., turned on) in a relatively short amount of time to provide a fast wakeup. The aforementioned first control signal SLPM_WL is used to power the output stages 104 up and down. In embodiments, control circuitry 103 controls the first control signal SLPM_WL to power the output stages 104 up and down, depending on the mode of operation.

To enable the output stages 104 to have a fast wakeup when the memory chip transitions from the standby mode to the active mode, the word-line driver 100 provides power to the decoder logic modules 102a, 102b, 102c and the output stages 104 using separate internal power supplies. As seen in FIG. 1, the decoder logic modules 102a, 102b, 102c of the decoder are powered by a first power supply VDDHD_X-DEC. By contrast, the output stages 104 disposed on the left- and right-hand sides of the word-line driver 100 are powered by second power supplies VDDHD_WL_L and VDDHD_WL_R, respectively. The second power supplies VDDHD_WL_L and VDDHD_WL_R are separate than and different from the first power supply VDDHD_XDEC.

By using the different first and second power supplies to power the decoder logic modules 102a, 102b, 102c and the output stages 104, respectively, this helps to ensure that the output stages 104 have a fast wakeup. Specifically, by using the separate power supplies, the second power supplies VDDHD_WL_L and VDDHD_WL_R used to power the output stages 104 only experience a small voltage drop in the standby mode, thus enabling the output stages 104 to wake up relatively quickly when transitioning from the standby mode to the active mode.

Figure 2:
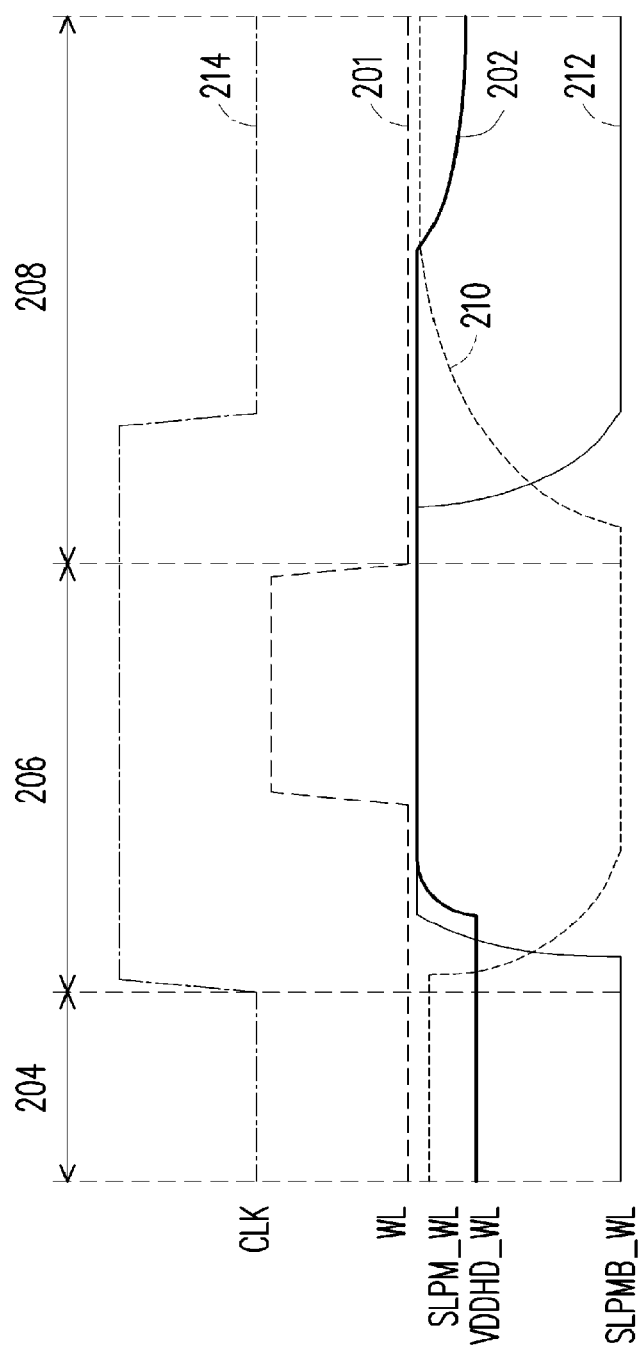
FIG. 2 is a timing diagram showing signals of the word-line driver of FIG. 1 in the time domain, in accordance with some embodiments.

To illustrate this, reference is made to FIG. 2. This figure is a timing diagram showing signals of the word-line driver 100 of FIG. 1 in the time domain, in accordance with some embodiments. Specifically, the figure shows the signals during standby modes 204, 208 and an active mode 206. During the standby modes 204, 208, the memory array is not being accessed, such that word-line voltages are clamped to a predetermined low voltage. The signal 201 (labeled "WL") is representative of a voltage of a word line and shows that the word line's voltage is clamped low during the standby modes 204, 208. During the active mode 206, selection of the word line causes the voltage of the word line to be pulled high, as illustrated by the signal 201.

In FIG. 2, the signal 202 (labeled "VDDHD_WL") is representative of a voltage of one of the second power supplies VDDHD_WL_L and VDDHD_WL_R of FIG. 1. As seen in the figure, the signal 202 has a voltage in the standby modes 204, 208 that is nearly equal to its voltage in the active mode 206. Because the voltage used to power the output stages 104 is only slightly less in the standby mode than it is in the active mode, this enables the output stages 104 to wake up relatively quickly when transitioning from the standby mode to the active mode. This is achieved through the use of the different first and second power supplies to power the decoder logic modules 102a, 102b, 102c and the output stages 104, respectively. As explained above, the decoder logic modules 102a, 102b, 102c of the decoder are powered by the first power supply VDDHD_X-DEC, and the output stages 104 disposed on the left- and right-hand sides of the word-line driver 100 are powered by second power supplies VDDHD_WL_L and VDDHD_WL_R, respectively. By using the different first and second power supplies to power the decoder logic modules 102a, 102b, 102c and the output stages 104, respectively, the second power supplies VDDHD_WL_L and VDDHD_WL_R used to power the output stages 104 have a voltage in the standby modes 204, 208 that is nearly equal to the voltage in the active mode 206. This enables the output stages 104 to wake up relatively quickly when transitioning from the standby mode to the active mode.

With reference again to FIG. 1, the word-line driver 100 further includes pull-down circuitry that includes second transistors 108, 110, 112, 114. As explained below, the pull-down circuitry, along with the use of the different power supplies to power the decoder logic modules 102a, 102b, 102c and the output stages 104, helps to ensure that the output stages 104 have a fast wakeup. The second transistors 108, 110, 112, 114 of the pull-down circuitry are coupled between the gates of the first transistors 101 and ground.

In the embodiment of FIG. 1, each of the second transistors 108, 110, 112, 114 is an n-type metal-oxide-semiconductor (NMOS) transistor with a drain terminal coupled to the gates of the first transistors 101 and a source terminal coupled to ground. Further, each of the second transistors 108, 110, 112, 114 includes a gate controlled by a second control signal SLPMB_WL. The second control signal SLPMB_WL is used to activate the pull-down circuitry, with the activation of the pull-down circuitry resulting in gate voltages of the first transistors 101 being pulled to a low voltage (e.g., ground). Pulling the gate voltages of the first transistors 101 low in this manner helps to wake up the output stages 104 more quickly. In embodiments, the control circuitry 103 controls the second control signal SLPMB_WL to activate the pull-down circuitry.

To illustrate use of the pull-down circuitry to wake up the output stages 104 more quickly, reference is made again to FIG. 2. As noted above, the first transistors 101 have gates controlled by the first control signal SLPM_WL, with the first control signal SLPM_WL being a sleep signal used to power down the output stages 104 in the standby mode and to wake up the output stages 104 in the active mode. In FIG. 2, the signal 210 (labeled "SLPM_WL") is representative of a voltage of the first control signal SLPM_WL. As seen in the figure, during the standby mode 204, the signal 210 has a high voltage (e.g., positive supply voltage or Vcc). The high voltage received at the gates of the first transistors 101 causes the first transistors 101 to be turned off during the standby mode, thus reducing the amount of leakage current in the output stages 104. During the transition from the standby mode 204 to the active mode 206, the signal 210 transitions from the high voltage to a low voltage (e.g., ground). The low voltage received at the gates of the first transistors 101 causes the first transistors 101 to be turned on during the active mode, such that current flows through them.

The pull-down circuitry enables the signal 210 to transition from the high voltage to the low voltage more quickly. In FIG. 2, the signal 212 (labeled "SLPMB_WL") is representative of a voltage of the second control signal SLPMB_WL received at the gates of the second transistors 108, 110, 112, 114 of the pull-down circuitry. As seen in the figure, during the standby mode 204, the signal 212 has a low voltage. In the embodiment of FIG. 1, where the second transistors 108, 110, 112, 114 are NMOS transistors, the low voltage causes these transistors to be turned off. During the transition from the standby mode 204 to the active mode 206, the signal 212 transitions from the low voltage to a high voltage. The high voltage received at the gates of the second transistors 108, 110, 112, 114 causes these transistors to be turned on during the active mode, such that current flows through them.

When this current flows through the second transistors 108, 110, 112, 114 in the active mode 206, the drain terminals of these transistors are pulled to the low voltage (e.g., ground). Because the gates of the first transistors 101 are electrically coupled to the drains of the second transistors 108, 110, 112, 114, as explained above, this causes the gate voltages of the first transistors 101 to be pulled to the low voltage as well. Accordingly, this enables the sleep signal SLPM_WL received at the gates of the first transistors 101 to transition from the high voltage to the low voltage more quickly upon entering the active mode 206, such that the output stages 104 have a faster wakeup.

With reference again to FIG. 1, the second transistors 108, 110, 112, 114 of the pull-down circuitry are spatially arranged and electrically connected in a manner that further facilitates the fast wakeup of the output stages 104. As seen in FIG. 1, the second transistors 108, 110, 112, 114 are positioned at the top and bottom edges of the cell, above the first row of the word-line driver 100 and below the last row of the word-line driver 100. With this arrangement, the second transistors 108, 110, 112, 114 of the pull-down circuitry pull the sleep signal SLPM_WL to the low voltage from both ends of its line, effectively decreasing the line to half of its size and enabling the sleep signal SLPM_WL to transition to the low voltage faster for a faster wakeup of the output stages 104.

Further, the second control signal SLPMB_WL used to active and deactivate the pull-down circuitry is only received at the second transistors 108, 110, 112, 114 and is not received at the first transistors 101 of the output stages 104. By contrast, the first control signal SLPM_WL is received at each of the first transistors 101. Because a number of the second transistors 108, 110, 112, 114 is less than a number of the first transistors 101, the second control signal SLPMB_WL activates the second transistors 108, 110, 112, 114 prior to the first control signal SLPM_WL activating the first transistors 101. Accordingly, this enables the second transistors 108, 110, 112, 114 to begin pulling down the gate voltages of the first transistors relatively quickly, further enabling the fast wakeup of the output stages 104.

As explained above, the output stages 104 of the word-line driver 100 are powered down in the standby mode in order to reduce leakage power. By contrast, in embodiments, the decoder logic modules 102a, 102b, 102c of the decoder remain active and are not powered down in the standby mode. The decoder logic modules 102a, 102b, 102c can remain powered up at all times (i.e., in both standby and active modes) because each includes the relatively small transistors that consume only a relatively small amount of leakage power while in the standby mode. Further, by keeping the decoder logic modules 102a, 102b, 102c powered up during the standby mode, this ensures that timing characteristics (e.g., set-up time) of the word-line driver 100 are not adversely affected.

Specifically, in embodiments, a clock generation circuit (not depicted in FIG. 1) transmits a clock signal to the word-line driver 100, and the word-line driver transitions from the standby mode to the active mode in response to a rising edge of the clock signal. With reference again to FIG. 2, the signal 214 is representative of the clock signal and illustrates that the rising edge of the clock signal triggers the transition from the standby mode 204 to the active mode 206. Upon the rising edge of the signal 214, the signal 210 representative of the voltage of the first control signal SLPM_WL begins transitioning from high to low in order to wake up the output stages 104. As explained above, the decoder logic modules 102a, 102b, 102c of the decoder are configured to decode an input address to provide word-line signals for driving word lines. For proper timing, the input address should be decoded prior to waking up the output stages 104 (i.e., the decoding should occur prior to the transition from the standby mode to the active mode). To ensure that this is the case, the decoder logic modules 102a, 102b, 102c of the decoder remain active at all times and are not powered down in the standby mode.

The word-line driver 100 of FIG. 1 achieves a lower leakage power than conventional word-line drivers without sacrificing speed or having adverse effects on timing characteristics. As described above, the output stages that are the source of significant leakage power in conventional designs are powered down during the standby mode in the word-line driver 100 of FIG. 1, thus providing a substantial reduction in the leakage power. To ensure that the output stages 104 have a fast wakeup when transitioning from the standby mode to the active mode, the word-line driver 100 utilizes separate power supplies for the decoding modules 102a, 102b, 102c and the output stages 104, as explained above. Fast wakeup is further ensured through the use of the pull-down circuitry including the second transistors 108, 110, 112, 114. Additionally, by keeping the decoding modules 102a, 102b, 102c of the decoder powered up during the standby mode, this ensures that timing characteristics of the word-line driver 100 are not adversely affected.

Figure 3:
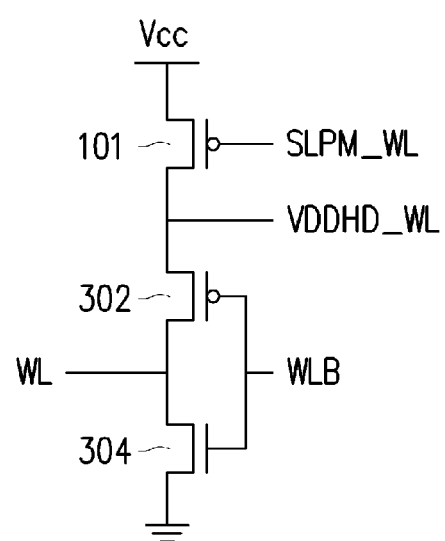
FIG. 3 is a circuit diagram depicting an output stage of the word-line driver of FIG. 1, in accordance with some embodiments.

As explained above, each of the output stages 104 includes multiple transistors that are relatively large in size. These transistors include the first transistor 101 (described above) and additional transistors used to form the inverter 106. To illustrate the transistors of a single output stage of the output stages 104, reference is made to FIG. 3. This figure is a circuit diagram depicting an output stage of the word-line driver of FIG. 1, in accordance with some embodiments. FIG. 3 depicts the first transistor 101 and additional transistors 302 and 304 that together form the inverter 106. In the embodiment of FIG. 3, the first transistor 101 is a PMOS transistor having a source terminal coupled to a positive supply voltage (e.g., Vcc), a drain terminal coupled to a second power supply VDDHD_WL (e.g., one of the second power supplies VDDHD_WL_L and VDDHD_WL_R of FIG. 1), and a gate controlled by the first control signal SLPM_WL.

Further, in the embodiment of FIG. 3, the transistor 302 is another PMOS transistor having a source terminal coupled to the drain terminal of the first transistor 101, a drain terminal coupled to a word line (labeled "WL"), and a gate controlled by one of the word-line signals (labeled "WLB") generated by the decoder. The transistor 304 is a NMOS transistor having a drain terminal coupled to the drain terminal of the transistor 302, a source terminal coupled to ground, and a gate controlled by the word-line signal. Because the transistors 302 and 304 are coupled together to form an inverter, the word-line signal received as an input is inverted to generate the output used to drive the word line.

The first transistor 101 controls the power to the transistors 302 and 304 of the inverter 106, thus enabling the inverter 106 to be powered down in the standby mode and powered up during the active mode. Specifically, the first transistor 101 includes the gate controlled by the first control signal SLPM_WL. When the first control signal SLPM_WL is high during the standby mode, the first transistor 101 is turned off, and no current flows through the transistors 101, 302, and 304. By contrast, when the first control signal SLPM_WL is low during the active mode, the first transistor 101 is turned on, and current flows through the transistors 101, 302, and 304.

Figure 4:
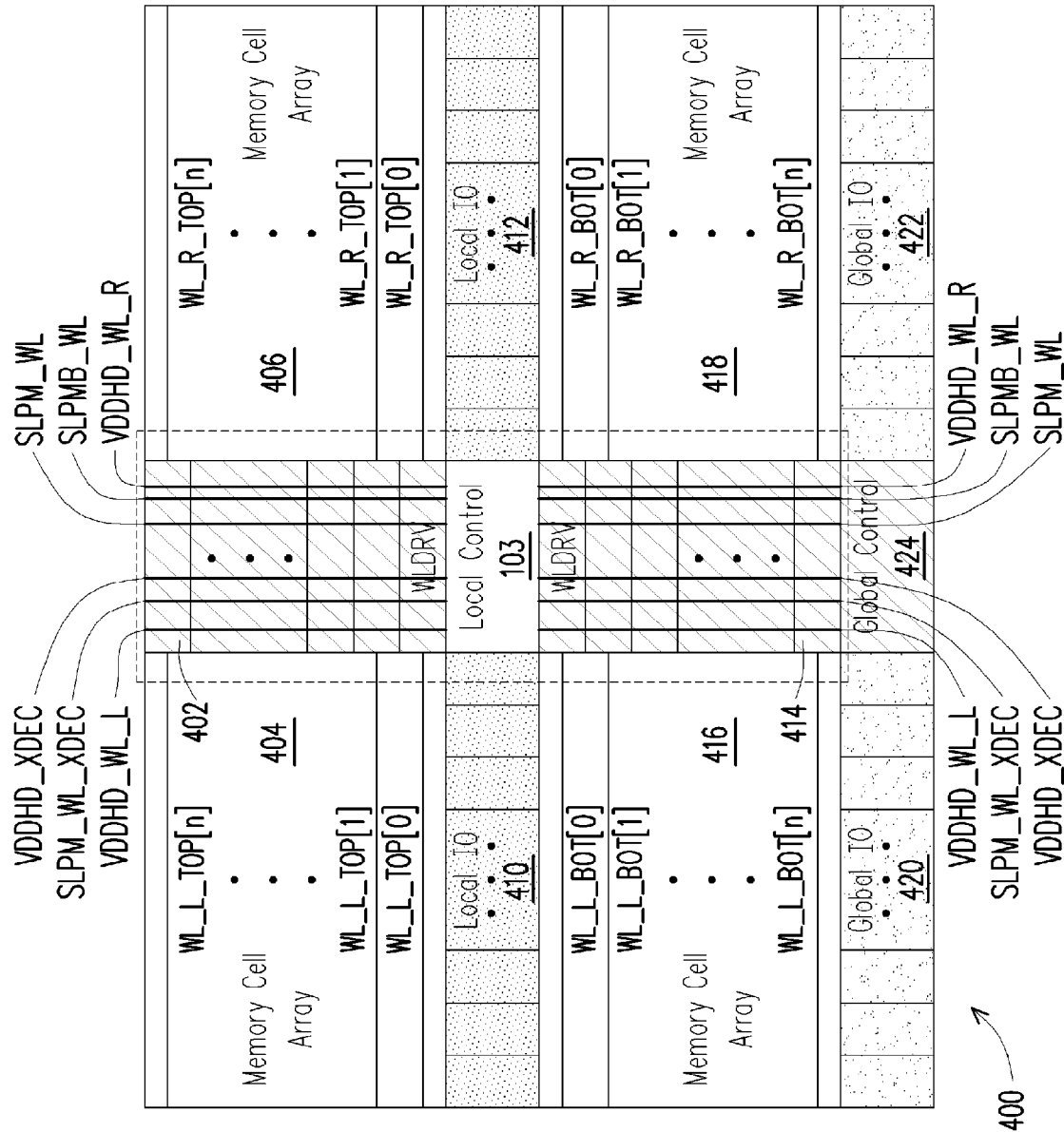
FIG. 4 is a block diagram depicting a memory device including multiple arrays of memory cells, in accordance with some embodiments.

FIG. 4 is a block diagram depicting a memory device 400 including multiple arrays of memory cells, in accordance with some embodiments. The memory device 400 includes a first word-line driver 402 disposed between first and second arrays of memory cells 404, 406. Each of the arrays of memory cells 404, 406 includes a plurality of memory cells (e.g., static random access memory (SRAM) cells, dynamic random access memory (DRAM) cells, etc.) arranged in rows and columns. Word lines WL_L_TOP[0]-[n] and WL_R_TOP[0]-[n] select rows of the respective arrays 404, 406, and bit lines (not illustrated in FIG. 4) select columns.

The first word-line driver 402 is the same as or similar to the word-line driver 100 of FIG. 1, in embodiments. Thus, the signals, lines, and power supplies depicted in FIG. 4 (i.e., VDDHD_WL_L, SLPM_WL_XDEC, VDDHD_XDEC, SLPM_WL, SLPMB_WL, and VDDHD_WL_R) should be understood as being the same as those described above with reference to FIG. 1. The first word-line driver 402 is configured to drive the word lines WL_L_TOP[0]-[n] and WL_R_TOP[0]-[n] to which it is coupled. The local control 103 (also described above with reference to FIG. 1) includes control circuitry configured to control operation of the first word-line driver 402. Specifically, the local control 103 controls one or more of VDDHD_WL_L, SLPM_WL_XDEC, VDDHD_XDEC, SLPM_WL, SLPMB_WL, and VDDHD_WL_R to direct the operation of the word-line driver 402. In embodiments, for example, the local control 103 controls the voltage of the first control signal SLPM_WL to power the output stages 104 up and down, depending on the mode of operation. Likewise, in embodiments, the local control 103 controls the voltage of the second control signal SLPMB_WL to activate the pull-down circuitry and facilitate faster wakeup of the output stages 104.

The memory device 400 further includes a second word-line driver 414 disposed between third and fourth arrays of memory cells 416, 418. Word lines WL_L_BOT[0]-[n] and WL_R_BOT[0]-[n] select rows of the respective arrays 416, 418. The second word-line driver 414 is the same as or similar to the word-line driver 100 of FIG. 1, in embodiments, and is configured to drive the word lines WL_L_TOP [0]-[n] and WL_R_TOP[0]-[n] to which it is coupled. The local control 103 controls operation of the second word-line driver 414 in a manner similar to its control of the first word-line driver 402.

Global control 424 is the main control block of the memory device 400, in embodiments. The global control 424 uses control inputs received from the outside world (e.g., chip-level inputs) and generates appropriate internal signals to perform requested operations. In embodiments, the global input/outputs (IOs) 420, 422 are disposed alongside the global control 424 and near the boundary of the memory device 400, as illustrated in FIG. 4. The global I/Os 420, 422 are coupled to the outside world, allowing a device (e.g., a processor, chip, etc.) to read from the memory device 400 and/or write to the memory device 400. Thus, in reading data from the memory device 400, data is read from the arrays 404, 406, 416, 418 and transmitted to one or more of the global I/Os 420, 422, enabling the data to be received by the device. Likewise, in writing data to the memory device 400, the device transmits the data to one or more of the global I/Os 420, 422, enabling this data to be written to the arrays 404, 406, 416, 418. In embodiments, there is one global IO block for each bit of the memory's word size.

The local control 103 and local IOs 410, 412 are present in a memory device including multiple arrays of memory cells, as in the example of FIG. 4. The local control 103 includes circuitry that operates on signals received from the global control 424 and generates other signals to perform requested operations. For example, based on signals received from the global control 424, the local control 103 generates signals to activate a certain word-line driver coupled to one of the arrays 404, 406, 416, 418. Further, in embodiments, based on signals received from the global control 424, the local control 103 generates signals sent to the local IOs 410, 412.

In a memory device including multiple arrays of memory cells, as in FIG. 4, the local IOs 410, 412 are disposed alongside the local control 103. The local IOs 410, 412 interface with bitlines from both the upper memory cell arrays 404, 406 and the lower memory cell arrays 416, 418. Further, the local IOs 410, 412 operate on control signals from the local control 103 and perform appropriate operations on selected bitlines (e.g., read or write data). The local IOs 410, 412 also interface with the global IOs 420, 422. Specifically, in embodiments, the local IOs 410, 412 (i) receive data to write from the global IOs 420, 422, and (ii) send data read from the arrays 404, 406, 416, 418 to the global IOs 420, 422.

Figure 5:
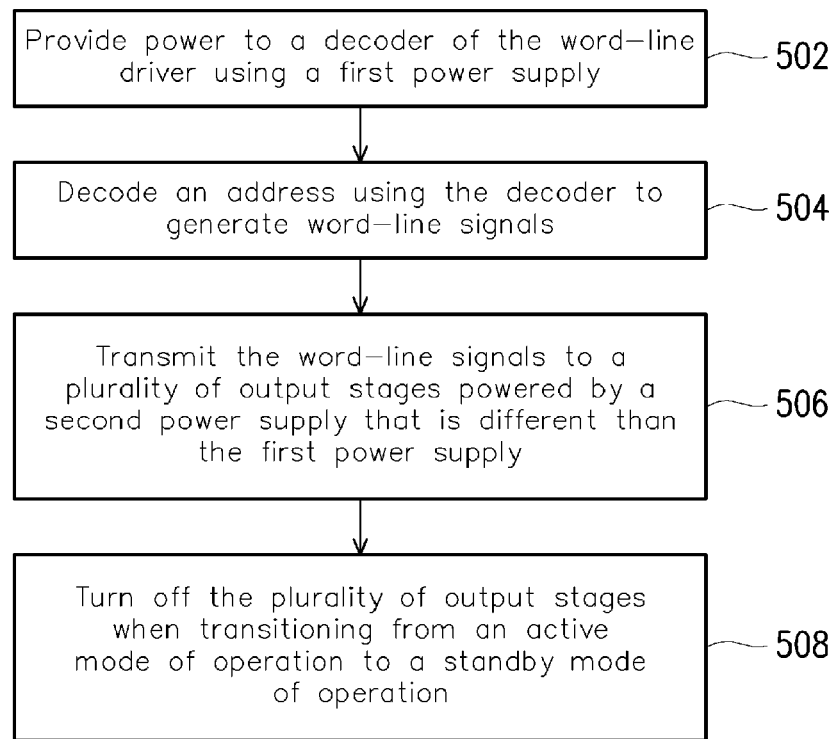
FIG. 5 is a flowchart depicting steps of an example method for operating a word-line driver, in accordance with some embodiments.

FIG. 5 is a flowchart depicting steps of an example method for operating a word-line driver, in accordance with some embodiments. FIG. 5 is described with reference to FIG. 1 above for ease of understanding. But the process of FIG. 5 is applicable to other hardware arrangements as well. At 502, power is provided to a decoder (i.e., a decoder including decoder logic modules 102a, 102b, 102c) of the word-line driver (i.e., word-line driver 100) using a first power supply (i.e., first power supply VDDHD_XDEC). At 504, an address (i.e., an address provided via line SLPM_WL_XDEC) is decoded using the decoder to generate word-line signals.

At 506, the word-line signals are transmitted to a plurality of output stages (i.e., output stages 104) of the word-line driver, where the plurality of output stages control voltage levels of word lines (i.e., word lines WL_L[0]-[n] or WL_R [0]-[n]) based on the word-line signals. The plurality of output stages are powered by a second power supply (i.e., second power supply VDDHD_WL) that is different than the first power supply. At 508, the plurality of output stages are turned off when transitioning from an active mode of operation to a standby mode of operation. In any of the methods disclosed herein, one or more of the described operations may omitted, and other operations may be added. Further, in any of the disclosed methods, the order of operations may vary from what is described herein. Thus, for instance, the operations 502, 504, 506, 508 of FIG. 5 need not be performed in the order shown in the figure.

The present disclosure in various embodiments is directed to word-line drivers, memories, and methods of operating word-line drivers. An example word-line driver coupled to an array of memory cells includes a decoder powered by a first power supply. The decoder is configured to decode an address to provide a plurality of word-line signals. The word-line driver also includes a plurality of output stages powered by a second power supply that is different than the first power supply. Each of the output stages includes a first transistor having a gate controlled by a first control signal and an inverter. The inverter is coupled between the first transistor and a ground and has an input coupled to the decoder to receive one of the word-line signals. The word-line driver also includes pull-down circuitry coupled between the gates of the first transistors and the ground and activated by a second control signal.

In another example, a memory includes an array of memory cells and a word-line driver configured to drive word lines coupled to the array of memory cells. The word-line driver includes a decoder configured to decode an address to provide a plurality of word-line signals. The word-line driver also includes a plurality of output stages, each of the output stages having an input coupled to the decoder to receive one of the word-line signals. The word-line driver further includes control circuitry configured to turn off the plurality of output stages in a standby mode during which the array of memory cells is not being accessed.

In an example method for operating a word-line driver, power is provided to a decoder of the word-line driver using a first power supply. An address is decoded using the decoder to generate word-line signals. The word-line signals are transmitted to a plurality of output stages of the word-line driver. The plurality of output stages control voltage levels of word lines based on the word-line signals and are powered by a second power supply that is different than the first power supply. The plurality of output stages are turned off when transitioning from an active mode of operation to a standby mode of operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A word-line driver coupled to an array of memory cells, the word-line driver comprising:
    a decoder powered by a first power supply;
    a plurality of output stages powered by second, third, and fourth power supplies, wherein the first, second, third, and fourth power supplies are different from each other, each of the output stages including a first transistor; and
    pull-down circuitry coupled between the first transistor and the fourth power supply, the pull-down circuitry configured to pull down gate voltages of transistors of the output stages to a low voltage, wherein the word-line driver is configured to operate in a standby mode during which the plurality of output stages are turned off.

2. The word-line driver of claim 1, wherein the pull-down circuitry comprises one or more second transistors coupled between gates of the first transistors and the fourth power supply, each of the second transistors including a gate controlled by a second control signal.

3. The word-line driver of claim 2, wherein a number of the second transistors is less than a number of the first transistors.

4. The word-line driver of claim 1, wherein each of the output stages further comprises an inverter, and wherein
    the first transistor comprises a first PMOS transistor coupled to the second power supply; and
    the inverter comprises (i) a second PMOS transistor coupled to the first PMOS transistor and having a gate controlled by one of a plurality of word-line signals, and (ii) a first NMOS transistor coupled between the second PMOS transistor and the fourth power supply.

5. The word-line driver of claim 4, wherein the pull-down circuitry comprises one or more second NMOS transistors coupled between gates of the first transistors and the fourth power supply, the one or more second NMOS transistors having gates controlled by a second control signal.

6. The word-line driver of claim 4, wherein the inverter has an output electrically connected to a word line that is coupled to the array of memory cells.

7. The word-line driver of claim 1, wherein the first transistor includes a gate controlled by a first control signal and is configured to provide power to the inverter based on a voltage of the first control signal.

8. The word-line driver of claim 1, wherein the decoder comprises a plurality of decoder logic modules, each of the decoder logic modules being coupled to one or more output stages of the plurality of output stages.

9. The word-line driver of claim 1, wherein the first transistor is coupled between the second and third power supplies.

10. A memory comprising:
    an array of memory cells; and
    a word-line driver configured to drive word lines coupled to the array of memory cells and including:
        a decoder powered by a first power supply,
        a plurality of output stages powered by second, third, and fourth power supplies, wherein the first, second, third, and fourth power supplies are different from each other, each of the output stages configured to turn off based on a first control signal, and
        control circuitry configured to pull gate voltages of transistors of the plurality of output stages to a low voltage, wherein the control circuitry is activated based on a second control signal, wherein the word-line driver is configured to operate in a standby mode during which the plurality of output stages are turned off.

11. The memory of claim 10, wherein each of the output stages includes (i) a first transistor having a gate controlled by the first control signal, and (ii) an inverter coupled between the first transistor and the fourth power supply, the memory further comprising:
pull-down circuitry coupled between the gates of the first transistors and the fourth power supply and activated by the second control signal.

12. The memory of claim 11, wherein
the pull-down circuitry comprises one or more second transistors coupled between the gates of the first transistors and the fourth power supply, each of the second transistors including a gate controlled by the second control signal.

13. The memory of claim 12, wherein a number of the second transistors is less than a number of the first transistors.

14. The memory of claim 11, wherein
the first transistor comprises a PMOS transistor coupled to the second power supply; and
the inverter comprises (i) a second PMOS transistor coupled to the first PMOS transistor and having a gate controlled by the one of the word-line signals, and (ii) a first NMOS transistor coupled between the second PMOS transistor and the fourth power supply.

15. The memory of claim 14, wherein the pull-down circuitry comprises one or more second NMOS transistors coupled between the gates of the first transistor and the fourth power supply, the one or more second NMOS transistors having gates controlled by the second control signal.

16. The memory of claim 10, wherein the decoder comprises a plurality of decoder logic modules, each of the decoder logic modules being coupled to one or more output stages of the plurality of output stages.

17. A method comprising:
providing power to a decoder of a word-line driver from a first power supply;
providing power to a plurality of output stages of the word-line driver from second, third, and fourth power supplies, wherein the first, second, third, and fourth power supplies are different from each other;
entering a standby mode during which the plurality of output stages are turned off;
using the decoder to generate word-line signals;
transmitting the word-line signals to the plurality of output stages of the word-line driver, the plurality of output stages controlling voltage levels of word lines based on the word-line signals, wherein the plurality of output stages are turned off based on a first control signal; and
activating pull-down circuitry of the word-line driver based on a second control signal, the pull-down circuitry pulling gate voltages of transistors of the output stages to a low voltage.

18. The method of claim 17, wherein the plurality of output stages are turned off based on the first control signal, the method further comprising:
activating pull-down circuitry of the word-line driver based on the second control signal, the pull-down circuitry pulling gate voltages of transistors of the output stages to a low voltage.

19. The method of claim 17, wherein the decoder is not turned off in a standby mode.

20. The method of claim 17, further comprising:
turning on the plurality of output stages when transitioning from a standby mode of operation to an active mode of operation.

* * * * *